US007645988B2

(12) United States Patent
Nagahama et al.

(10) Patent No.: US 7,645,988 B2
(45) Date of Patent: Jan. 12, 2010

(54) SUBSTRATE INSPECTION METHOD, METHOD OF MANUFACTURING SEMICONDUCTOR DEVICE, AND SUBSTRATE INSPECTION APPARATUS

(75) Inventors: Ichirota Nagahama, Ibaraki (JP); Yuichiro Yamazaki, Tokyo (JP); Atsushi Onishi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 445 days.

(21) Appl. No.: 11/137,473

(22) Filed: May 26, 2005

(65) Prior Publication Data

US 2005/0263701 A1    Dec. 1, 2005

(30) Foreign Application Priority Data

May 28, 2004    (JP)    ............................. 2004-159089

(51) Int. Cl.
*G21K 7/00*    (2006.01)
(52) U.S. Cl. ..................... 250/310; 250/311; 250/307; 438/14
(58) Field of Classification Search .................. 250/310
See application file for complete search history.

(56) References Cited

U.S. PATENT DOCUMENTS 5,576,833 A    11/1996    Miyoshi et al.
6,593,152 B2 *  7/2003    Nakasuji et al. ............... 438/14

FOREIGN PATENT DOCUMENTS

| JP | 04-242060 | 8/1992 |
| JP | 7-249393 | 9/1995 |
| JP | 11-132975 | 5/1999 |
| JP | 11-345585 | 12/1999 |

OTHER PUBLICATIONS

Tsuno, "Simulation of a Wien filter as beam separator in a low energy electron microscope", Ultramicroscopy 55, pp. 127-140, (1994).
Notification of Reason for Rejection issued by the Japanese Patent Office on Sep. 9, 2008, for Japanese Patent Application No. 2004-159089, and English-language translation thereof.

* cited by examiner

*Primary Examiner*—David A. Vanore
*Assistant Examiner*—Phillip A. Johnston
(74) *Attorney, Agent, or Firm*—Finnegan, Henderson, Farabow, Garrett & Dunner, L.L.P.

(57) ABSTRACT

A substrate inspection method includes:
  generating an electron beam and irradiating the electron beam as a primary electron beam to a substrate as a specimen;
  inducing at least any of a secondary electron, a reflected electron and a backscattering electron which are emitted from the substrate receiving the primary electron beam, and magnifying and projecting the induced electron as a secondary electron beam so as to form an image of the secondary electron beam; a trajectory of the primary electron beam and a trajectory of the secondary electron beam having an overlapping space and space charge effect of the secondary electron beam occurring in the overlapping space,
  detecting the image of the secondary electron beam to output a signal representing a state of the substrate; and
  suppressing aberration caused by the space charge effect in the overlapping space.

17 Claims, 7 Drawing Sheets

SUBSTRATE INSPECTION METHOD, METHOD OF MANUFACTURING SEMICONDUCTOR DEVICE, AND SUBSTRATE INSPECTION APPARATUS

CROSS REFERENCE TO RELATED APPLICATION

This application claims benefit of priority under 35 USC §119 to Japanese Patent Application No. 2004-159089, filed on May 28, 2004, the contents of which are incorporated by reference herein.

BACKGROUND OF THE INVENTION

1. Field of the Invention

The present invention relates to a substrate inspection method, a method of manufacturing a semiconductor device and a substrate inspection apparatus.

2. Related Art

In recent years, methods of inspecting defects in semiconductor patterns by utilizing electron beams have been proposed. For example, there is disclosed in Japanese Patent Laid-Open No. 7 (1995)-249393 a method which includes: generating a rectangular electron beam as a primary electron beam by an electron irradiator and irradiating a specimen with the electron beam; then enlarging and projecting an image of secondary electrons, reflected electrons and backscattered electrons generated according to the change of the shape/properties/potential of the specimen surface, as a secondary electron beam, on an electron detector by a mapping projection optical system; and obtaining an image of the specimen surface. In addition to the method, another method has been proposed in Japanese Patent Laid-Open No. 11 (1999) -132975, by which a primary electron beam is deflected by a Wien filter as an electron beam deflector so as to be nearly perpendicularly incident on a specimen surface, and also a secondary electron beam is made to travel straight through the same Wien filter so as to enter a mapping projection optical system.

In the apparatus disclosed in Japanese Patent Laid-Open No. 11 (1999)-132975, the Wien filter is used to form a Koehler illumination system in order to make the primary electron beam perpendicularly incident on the specimen surface. Specifically, the primary electron beam entering the Wien filter is deflected by the Wien filter so that the focus of the primary electron beam coincides with the focus of the secondary beam between the Wien filter and a cathode lens. Further, in order to minimize the effect of deflection aberration in the Wien filter, an image of the secondary electron beam is once formed on the center surface of the Wien filter.

However, the apparatus disclosed in Japanese Patent Laid-Open No. 11 (1999)-132975, in which there exists space where the primary electron beam overlaps with the secondary electron beam between the Wien filter and the specimen, has a problem in that the aberration of the secondary electron beam is increased by the significant influence of the electron-electron interaction, i.e. the so-called space charge effect due to the high electron density in this overlapping space. In particular, the current density of the secondary electron beam is the highest at the focus position of the secondary electron beam, and the focus position of the primary electron beam where the current density of the primary electron beam is the highest is also exists at the same position, as a result of which the space charge effect of the secondary electron beam becomes most significant in the above described overlapping space.

BRIEF SUMMARY OF THE INVENTION

According to a first aspect of the present invention, there is provided a substrate inspection method comprising:

generating an electron beam and irradiating the electron beam as a primary electron beam to a substrate as a specimen;

inducing at least any of a secondary electron, a reflected electron and a backscattering electron which are emitted from the substrate receiving the primary electron beam, and magnifying and projecting the induced electron as a secondary electron beam so as to form an image of the secondary electron beam; a trajectory of the primary electron beam and a trajectory of the secondary electron beam having an overlapping space and space charge effect of the secondary electron beam occurring in the overlapping space, detecting the image of the secondary electron beam to output a signal representing a state of the substrate; and suppressing aberration caused by the space charge effect in the overlapping space.

According to a second aspect of the present invention, there is provided a method of manufacturing a semiconductor device comprising a substrate inspection method including:

generating an electron beam and irradiating the electron beam as a primary electron beam to a substrate as a specimen;

inducing at least any of a secondary electron, a reflected electron and a backscattering electron which are emitted from the substrate receiving the primary electron beam, and magnifying and projecting the induced electron as a secondary electron beam so as to form an image of the secondary electron beam; a trajectory of the primary electron beam and a trajectory of the secondary electron beam having an overlapping space and space charge effect of the secondary electron beam occurring in the overlapping space, detecting the image of the secondary electron beam to output a signal representing a state of the substrate; and suppressing aberration caused by the space charge effect in the overlapping space.

According to a third aspect of the present invention, there is provided a substrate inspection apparatus comprising:

an electron beam irradiator which generates an electron beam and which irradiates the electron beam as a primary electron beam to a substrate as a specimen;

a detector with a detecting surface to detect at least any of a secondary electron, a reflected electron and a backscattering electron which are emitted from the substrate receiving the primary electron beam, the detector outputting a signal representing a state of the substrate;

a mapping projection optical system which induces at least any of the secondary electron, the reflected electron and the backscattering electron so as to magnify and project the induced electron as a secondary electron beam, and which forms an image of the secondary electron beam on the detecting surface of the detector; a trajectory of the primary electron beam and a trajectory of the secondary electron beam having an overlapping space and space charge effect of the secondary electron beam occurring in the overlapping space, and an aberration suppressor which suppresses aberration caused by the space charge effect in the overlapping space.

DETAILED DESCRIPTION OF THE INVENTION (1) First Embodiment

Figure 1:
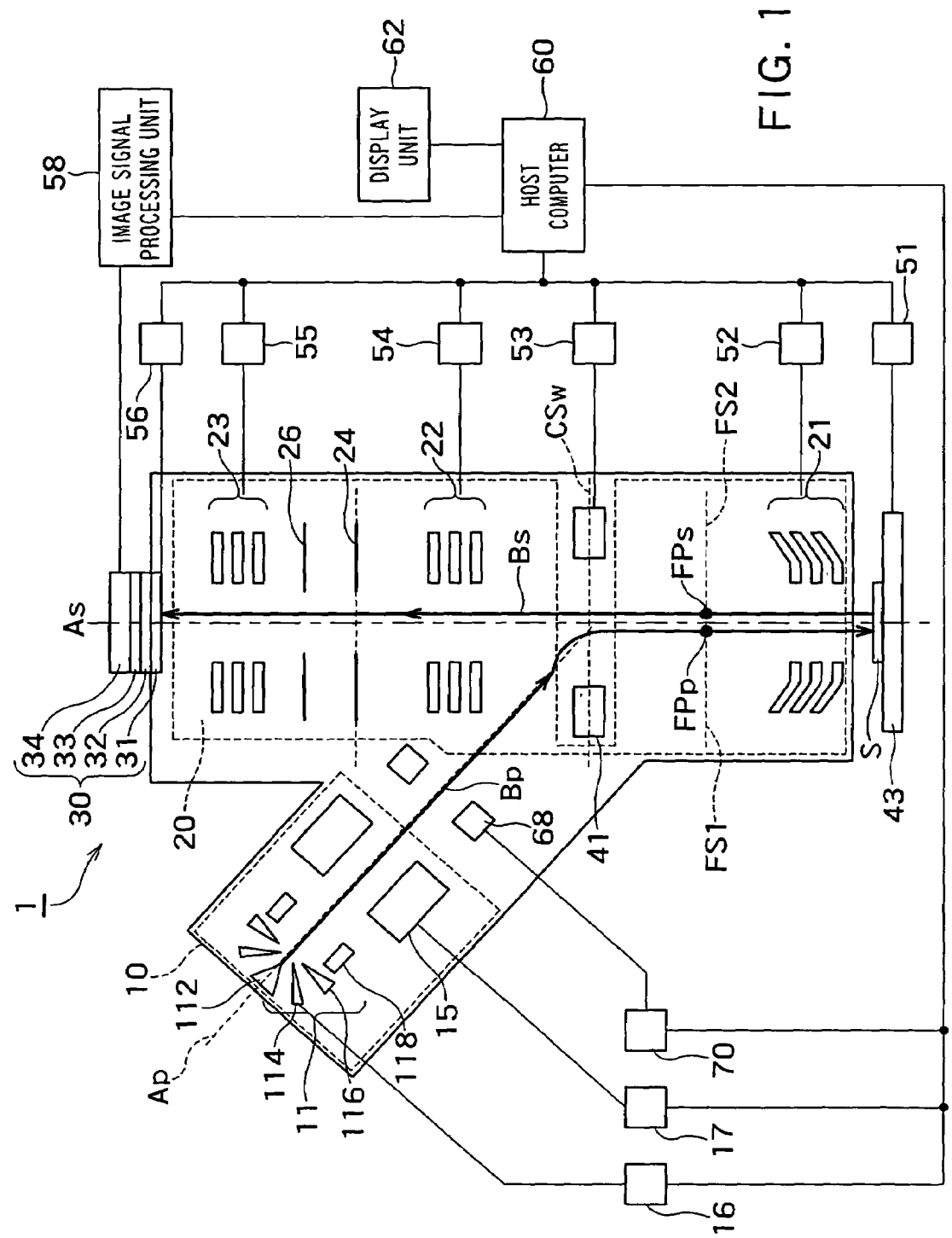
FIG. 1 is a block diagram schematically showing a configuration of a substrate inspection apparatus according to a first embodiment of the present invention.

FIG. 1 is a block diagram schematically showing a configuration of a substrate inspection apparatus according to a first embodiment of the present invention. As will be described in further detail below, the present embodiment is characterized in that a deflector 68 is arranged between multistage quadrupole lenses 15 and a Wien filter 41, and in that the deflector 68 controls a trajectory of a primary electron beam Bp so as to shrink space where the primary electron beam Bp overlaps with a secondary electron beam Bs.

The substrate inspection apparatus 1 shown in FIG. 1 comprises a primary optical system 10, a secondary optical system 20, an electron detecting unit 30, the Wien filter 41, a stage 43, various control units 16, 17, 51 to 56, 70, an image signal processing unit 58, a host computer 60 and a display unit 62.

The primary optical system 10 includes an electron beam gun 11 and the multistage quadrupole lenses 15. The electron beam gun 11, which corresponds to e.g. electron beam irradiating means, has a LaB6 line cathode 112 having a rectangular electron emitting surface with the long axis of 100 to 700 μm and the short axis of 15 μm, a Wehnelt electrode 114, an anode 116 to derive an electron beam and a deflector 118 to adjust an optical axis. The LaB6 line cathode 112, the Wehnelt electrode 114, the anode 116 and the deflector 118 are connected to the control unit 16, and an acceleration voltage, an ejecting current and an optical axis Ap of the primary electron beam Bp are controlled by a signal from the control unit 16. The quadrupole lenses 15 are connected to the quadrupole lenses control unit 17. The primary electron beam Bp emitted from the line cathode 112 is converged by the quadrupole lenses 15 controlled by a signal from the quadrupole lenses control unit 17, and is incident obliquely on the Wien filter 41. The primary electron beam Bp is deflected in the direction perpendicular to a specimen S by the Wien filter 41, and then subjected to a lens action by a cathode lens 21 in the secondary optical system 20 so as to be irradiated perpendicularly to the specimen S.

The specimen S is placed on the top surface of the stage 43, which is arranged such that a negative voltage can be applied to the specimen S by the stage voltage control unit 51. This arrangement is to reduce the incidence damage of the specimen S caused by the primary electron beam Bp, and to increase the energy of the secondary electron beam Bs consisting of secondary electrons, reflected electrons and back-scattered electrons which are generated according to the change of the shape/properties/potential of the specimen S surface by the irradiated primary electron beam Bp.

Figure 2:
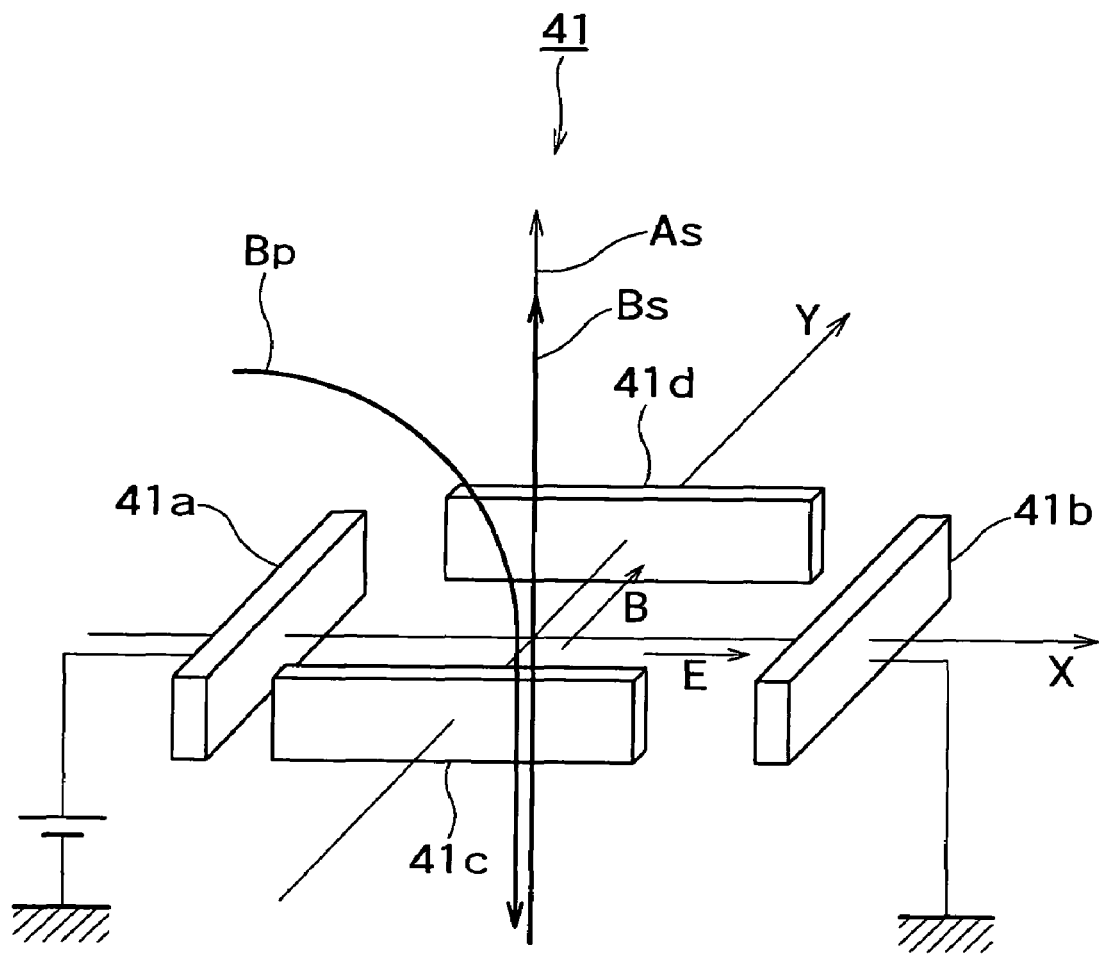
FIG. 2 is a perspective view showing a specific configuration of a Wien filter provided for the substrate inspection apparatus shown in FIG. 1.
Figure 3:
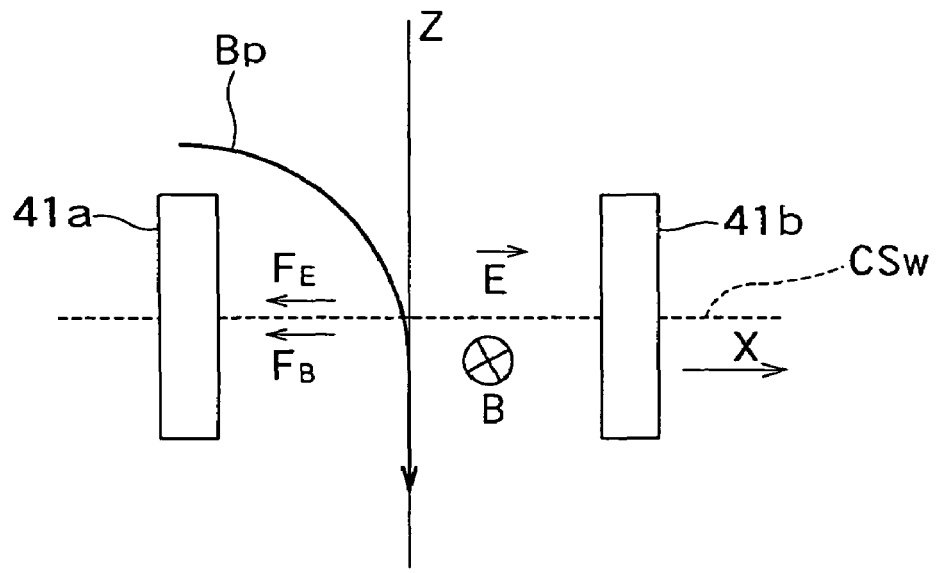
FIG. 3 is an illustration of an operation principle of the Wien filter shown in FIG. 2.
Figure 4:
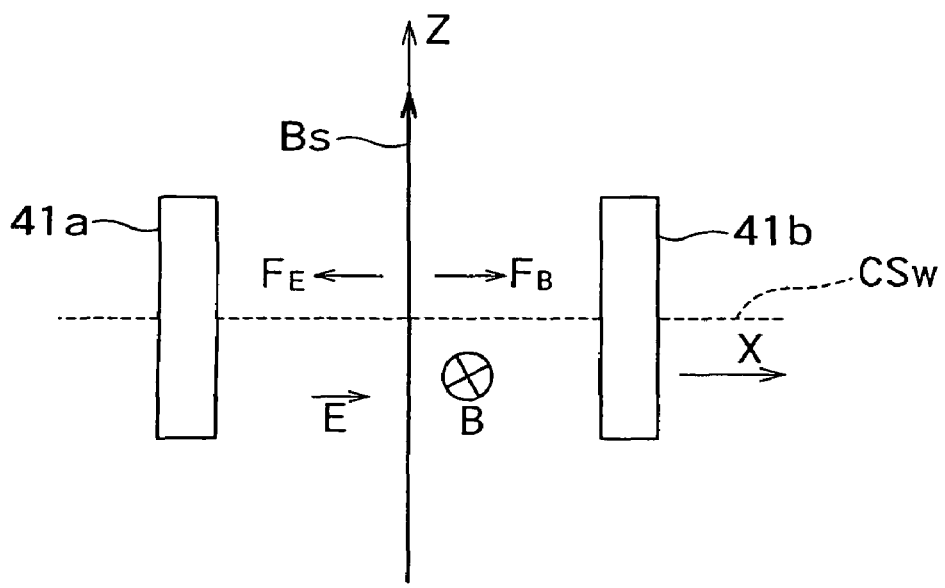
FIG. 4 is an illustration of an operation principle of the Wien filter shown in FIG. 2.

FIG. 2 shows a specific configuration of the Wien filter 41, the operation principle of which is described briefly with reference to FIG. 3 and FIG. 4. As shown in FIG. 2, the fields of the Wien filter 41 are formed so as to make the electric field E and the magnetic field B orthogonal to each other in a plane CSw perpendicular to an optical axis As of the secondary optical system, and functions to allow only those electrons among the incident electrons which meet the Wien condition of $qE=vB$ (q: electron charge, v: velocity of electron advancing straight), to advance straight. As shown in FIG. 3, in the inspection device 1, the force FB of the magnetic field and the force FE of the electric field acts on the primary electron beam Bp in the same direction so that the primary electron beam Bp is deflected so as to be perpendicularly incident on the specimen S. On the other hand, as shown in FIG. 4, the FB and the FE act on the secondary electron beam Bp in the reverse direction and the Wien condition of FB=FE is still established, as a result of which the secondary electron beam Bs advances straight to enter the secondary optical system without being deflected.

Returning to FIG. 1, the secondary optical system 20, which corresponds to e.g. mapping projection means, includes the cathode lens 21 which is a rotationally symmetric electrostatic lens, a second lens 22, a third lens 23 and a numerical aperture 24 and a field aperture 26, which apertures are arranged between the second and third lenses. The cathode lens 21, the second lens 22, the third lens 23, are connected to the secondary optical system lens control units 52, 54, 55, respectively, and the secondary electron beam Bs is enlarged and projected by control signals outputted from these control units so that an image of the secondary electron beam is formed on a detecting surface of a MCP (Micro Channel plate) detector 31.

The electron detecting unit 30, which corresponds to e.g. detecting means, includes the MCP detector 31, a fluorescent plate 32, a light guide 33 and an imaging element 34, such as CCD (Charged Coupled Device). The secondary electron beam Bs incident on the MCP detector 31 is amplified by the MCP and irradiated to the fluorescent plate 32. A fluorescent image generated by the fluorescent plate 32 is detected by the imaging element 34 via the light guide 33. A signal outputted from the imaging element 34 is processed by the image signal processing unit 58 and transmitted to the host computer 60 as image data.

The host computer 60 is connected to the various control units 16, 17, 51 to 56, 70, and controls the overall apparatus via these control units. The host computer 60, which is also connected to the image signal processing unit 58 and the display unit 62, receives the image data from the image signal processing unit 58 and stores the image data in an image memory (not shown), and displays the image of the secondary electron beam in the display unit 62, and also performs a defect detecting processing, etc. by means of image processing corresponding to an inspection object.

In this apparatus, a Koehler illumination system is formed to make the primary electron beam Bp perpendicularly incident on the specimen S. Heretofore, in order to form the Koehler illumination system, a measure has been used to make a focus FPp of the primary electron beam coincide with a focus FPs of the secondary electron beam. The measure can be realized by deflecting the primary electron beam Bp with the Wien filter 41 so that the focus FPp of the primary electron beam coincide with the focus FPs of the secondary electron beam between the Wien filter 41 and the cathode lens 21.

Figure 5:
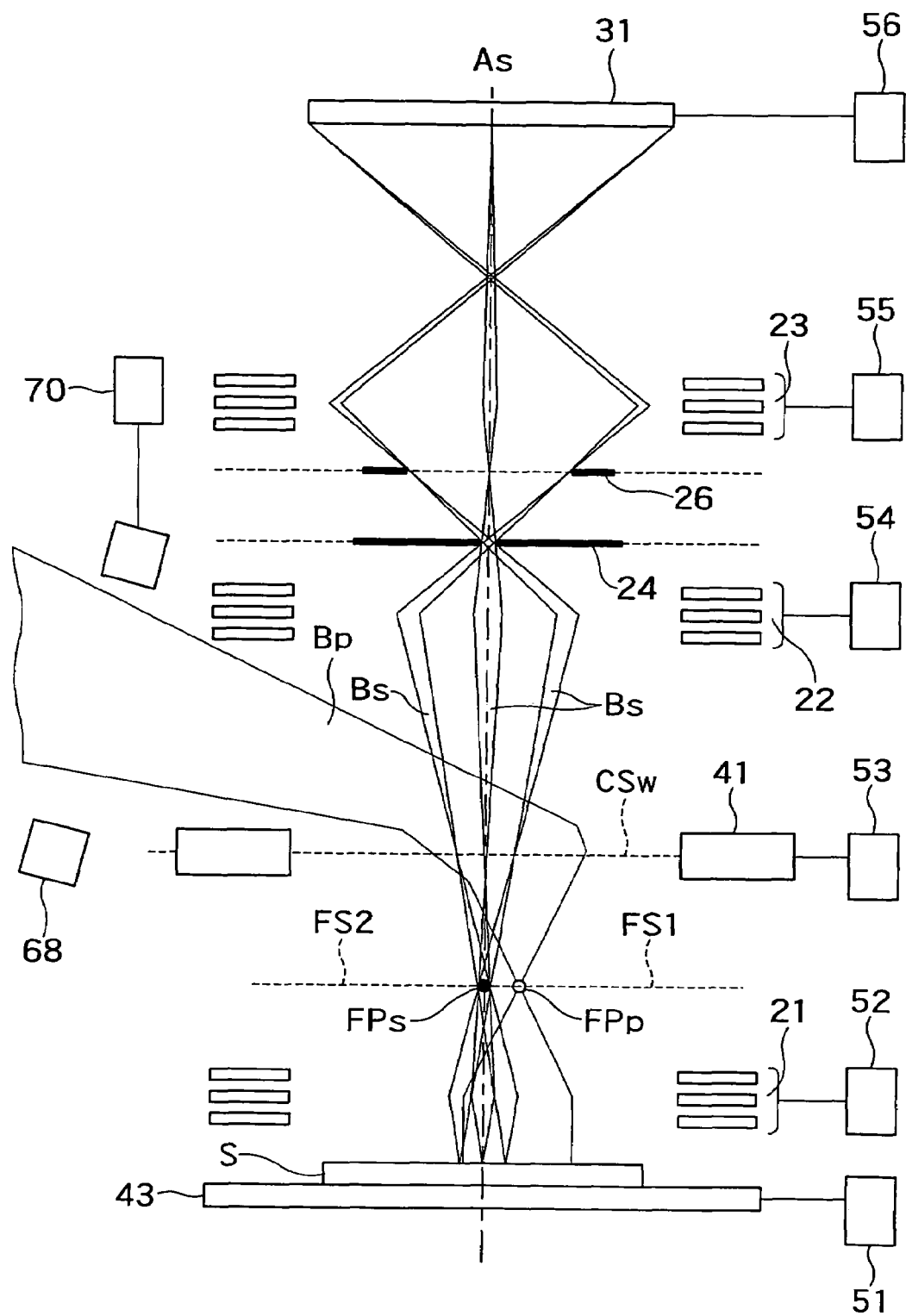
FIG. 5 is an electron beam trajectory figure explaining a substrate inspection method according to the first embodiment of the present invention.

However, between the Wien filter 41 and the specimen S there exists space where the trajectory of the primary electron beam Bp overlap with the trajectory of the secondary electron beam Bs (see FIG. 5). In this space, the influence of the electron-electron interaction, i.e. the so-called space charge effect becomes significant due to the high electron density in this space, thereby causing a problem that the aberration of the secondary electron beam Bs is increased. In particular, since the current density of each beam is the highest in any of the focus position FPp of the primary electron beam and the focus position FPs of the secondary electron beam, in the case where the focus FPp of the primary electron beam is made to coincide with the focus FPs of the secondary electron beam, the aberration of the secondary electron beam Bs is significantly increased by the synergistical action of the space charge effect. In order to reduce the aberration of the secondary electron beam Bs, it is most effective to shrink the space charge effect in the focus position FPs of the secondary electron beam.

The substrate inspection apparatus 1 according to the present embodiment controls deflection of the primary electron beam Bp by means of the deflector 68 arranged between the multistage quadrupole lenses 21 and the Wien filter 41, and thereby suppresses the increase of aberration due to the space charge effect of the secondary electron beam Bs without considerably impairing the Koehler illumination for the primary electron beam Bp. The deflector 68 is connected to the deflection control unit 70, and the deflection control unit 70 is further connected to the host computer 60. The host computer 60 generates a control signal for deflecting the primary electron beam Bp so that the space charge effect in the focus position FPs of the secondary electron beam is reduced and thereby the resolution of the secondary electron beam image is improved, and transmits the control signal to the deflection control unit 70. The deflection control unit 70 receives the control signal from the host computer 60, and applies a deflection voltage corresponding to the control signal to each electrode of the deflector 68, whereby the deflector 68 forms a deflection field to deflect the primary electron beam Bp. When the primary electron beam Bp is deflected excessively, however, the center of illumination area on the specimen S is largely deviated from the optical axis As of the secondary optical system, so that the primary electron beam Bp is not irradiated sufficiently to the intersection of the optical axis As of the secondary optical system and the surface of the specimen S and to the vicinity of the intersection, where the lowest aberration is expected. As a result, sufficient quantity of the secondary electrons/reflected electrons/backscattering electrons are not emitted from the intersection of the optical axis As of the secondary optical system and the surface of the specimen S and from the vicinity of the intersection, so that the S/N of signals outputted from the imaging element 34 is lowered so as to deteriorate the inspection image. The host computer 60 performs control to optimize the deflection of the primary electron beam Bp within a range in which these adverse effects cause no problem in the inspection.

Thus, as in the electron beam trajectory figure shown in FIG. 5, the host computer 60 performs the deflection control of the primary electron beam Bp so as to make a focal surface FS1 of the primary electron beam Bp coincide with a focal surface FS2 of the secondary electron beam Bs, and to prevent the focus position FPs of the secondary electron beam where the current density of the secondary electron beam is the highest in the above described overlapping space from coinciding with the focus position FPp of the primary electron beam where the current density of the primary electron beam Bp is the highest in the overlapping space. Thereby, the increase of aberration of the secondary electron beam Bs due to the space charge effect can be effectively suppressed without considerably impairing the Koehler illumination for the primary electron beam Bp. In the present embodiment, the overlapping space of the primary electron beam Bp and the secondary electron beam Bs is shrunk by controlling the trajectory of the primary electron beam Bp, but the embodiment is not limited to the case, it is also possible to shrink the above described overlapping space by controlling the trajectory of the secondary electron beam Bs.

(2) Second Embodiment

Figure 6:
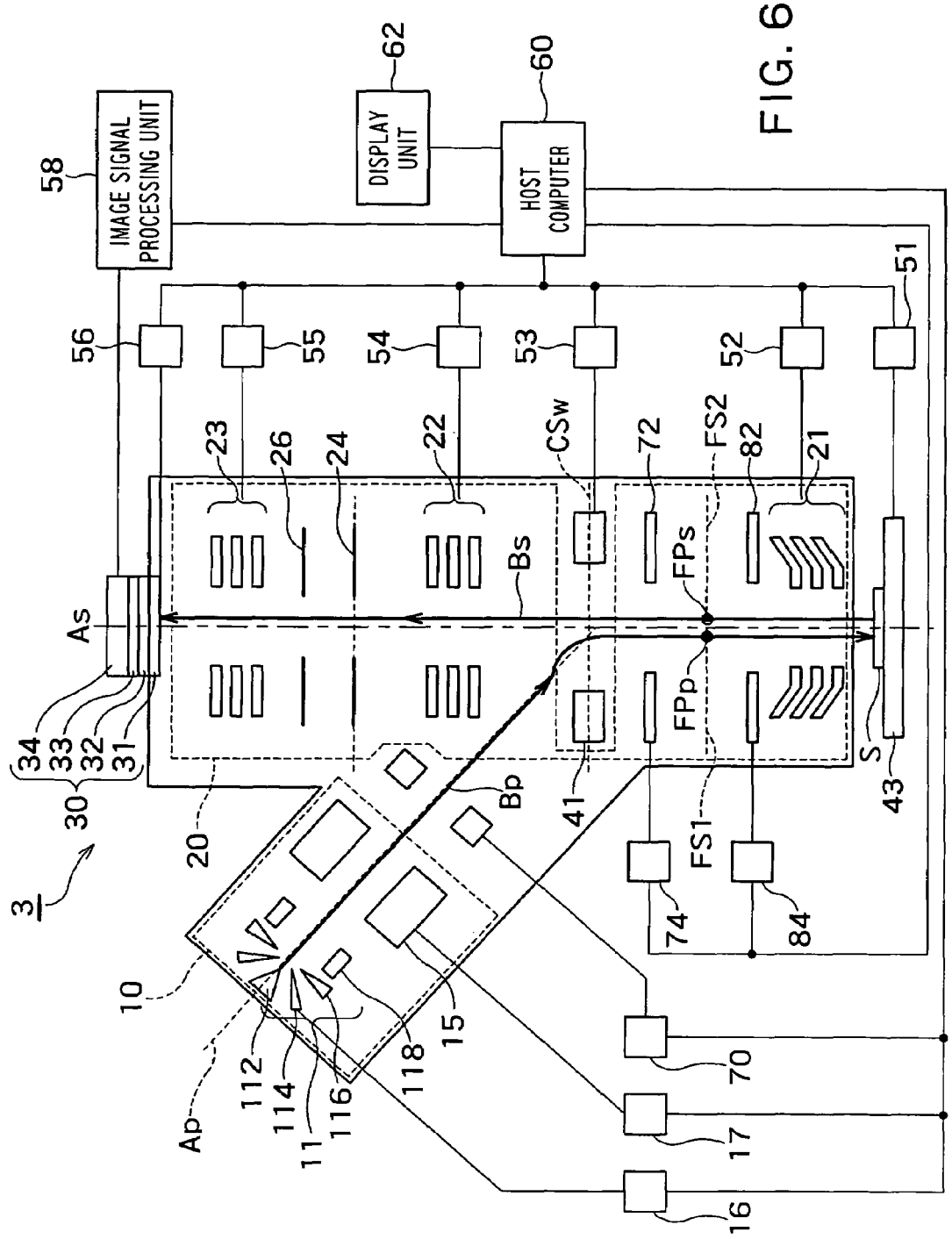
FIG. 6 is a block diagram schematically showing a configuration of a substrate inspection apparatus according to a second embodiment of the present invention.
Figure 7:
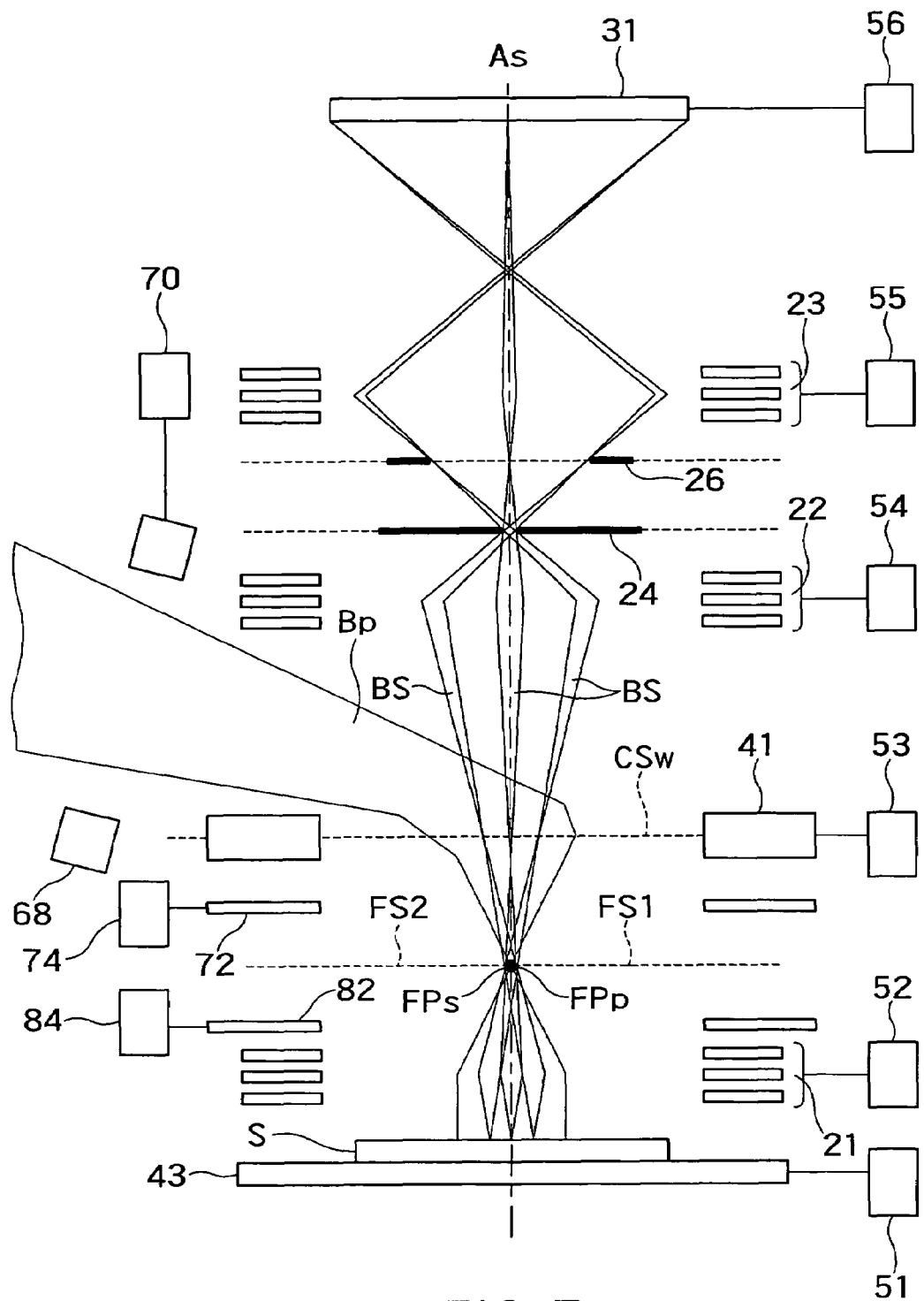
FIG. 7 is an electron beam trajectory figure explaining a substrate inspection method according to the second embodiment of the present invention.

FIG. 6 is a block diagram schematically showing a configuration of a substrate inspection apparatus according to a second embodiment of the present invention, and FIG. 7 is an electron beam trajectory figure explaining a substrate inspection method according to the present embodiment of the present invention. A substrate inspection apparatus 3 according to the present embodiment is characterized in that rotationally symmetric round hole electrodes 72, 82 which are arranged between the Wien filter 41 and the cathode lens 21 and which are connected to power supplies 74, 84, respectively, are further provided, and in that the secondary electron beam Bs is accelerated in the overlapping space of the primary electron beam Bp and the secondary electron beam Bs, by an acceleration electric field formed by the electrodes 72, 82.

Figure 8:
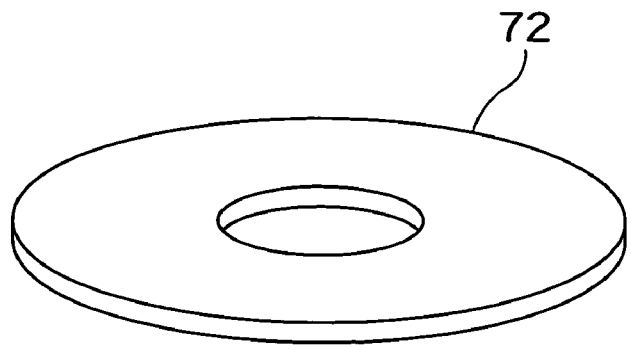
FIG. 8 is a perspective view showing a round hole electrode provided for the substrate inspection apparatus shown in FIG. 6.
Figure 9A:
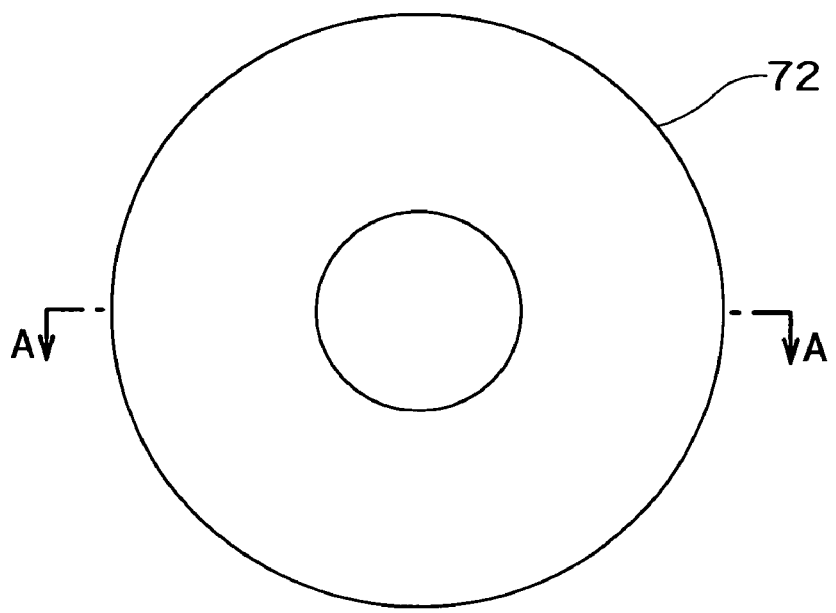
FIG. 9A and FIG. 9B are a top view and side view of the round hole electrode provided for the substrate inspection apparatus shown in FIG. 6, respectively.
Figure 9B:

FIG. 8 is a perspective view showing the electrode 72. FIG. 9A shows a top view of the electrode 72 and FIG. 9B shows a side view along the line A-A in FIG. 9A. As typically shown in FIG. 8, FIG. 9A and FIG. 9B, the electrodes 72, 82 are provided at the center thereof with a round hole for allowing the passage of the secondary electron beam Bs, respectively.

Returning to FIG. 6, the electrode voltage applying power supplies 74, 84 are further connected to the host computer 60. The host computer 60 generates a control signal to form the acceleration electric field to accelerate the secondary electron beam Bs, and supplies the signal to the power supplies 74, 84. The electrode voltage applying power supplies 74, 84 apply voltages in accordance with the control signal from the host computer 60 to the electrodes 72, 82, so as to accelerate the secondary electron beam Bs between the electrodes 72, 82. In order to form the acceleration electric field for the secondary electron beam Bs, for example, it is only necessary that a positive voltage is applied to the electrode 72 and a positive voltage lower than the positive voltage applied to the electrode 72 or a negative voltage or 0 voltage is applied to the electrode 82.

Since the current density is the highest at the focus position of the secondary electron beam Bs, in the case where the focus position of the secondary electron beam Bs is included in the space where the secondary electron beam Bs is accelerated, the increase of aberration of the secondary electron beam Bs due to the space charge effect can be effectively suppressed without impairing the Koehler illumination system for the primary electron beam Bp. In the present embodiment, as shown in the electron beam trajectory figure in FIG. 7, the electrode 72 and the electrode 82 are arranged so that the focal surface FS1 of the primary electron beam coincides with the focal surface FS2 of the secondary electron beam, that the focus position FPp of the primary electron beam where the current density of the primary electron beam Bp is the highest in the overlapping space of the primary electron beam Bp and the secondary electron beam Bs, coincides with the focus position FPs of the secondary electron beam where the current density of the secondary electron beam Bs is the highest in the above described overlapping space, and that the focal surface FS2 of the secondary electron beam exists between the electrode 72 and the electrode 82.

(3) Method of Manufacturing Semiconductor Device

The use of the above described substrate inspection method in the manufacturing process of a semiconductor device enables a semiconductor device to be inspected with high sensitivity and to thereby be manufactured in a short TAT (Turn Around Time) and with a high yield.

What is claimed is:

1. A substrate inspection method comprising:
generating an electron beam and irradiating the electron beam as a primary electron beam to a substrate as a specimen;
inducing at least any of a secondary electron, a reflected electron, and a backscattering electron which are emitted from the substrate receiving the primary electron beam, and magnifying and projecting the induced electron as a secondary electron beam so as to form an image of the secondary electron beam, a trajectory of the primary electron beam and a trajectory of the secondary electron beam having an overlapping space and a space charge effect of the secondary electron beam occurring in the overlapping space;
detecting the image of the secondary electron beam to output a signal representing a state of the substrate; and
deflecting at least one of the primary electron beam and the secondary electron beam so as to shrink the overlapping space, thereby suppressing aberration caused by the space charge effect in the overlapping space,
wherein the primary electron beam or the secondary electron beam is deflected so that the primary electron beam has a focus at a position which is different from a focus of the secondary electron beam, and the focus of the primary electron beam and the focus of the secondary electron beam lie on a single focal surface.

2. A substrate inspection method comprising:
generating an electron beam and irradiating the electron beam as a primary electron beam to a substrate as a specimen via a cathode lens field;
inducing at least any of a secondary electron, a reflected electron, and a backscattering electron which are emitted from the substrate receiving the primary electron beam, and magnifying and projecting the induced electron as a secondary electron beam so as to form an image of the secondary electron beam, a trajectory of the primary electron beam and a trajectory of the secondary electron beam having an overlapping space and a space charge effect of the secondary electron beam occurring in the overlapping space;
detecting the image of the secondary electron beam to output a signal representing a state of the substrate;
generating an electromagnetic field which induces at least any of the secondary electron, the reflected electron and the backscattering electron without deflection so as to make the induced electron emit as the secondary electron beam, and which deflects the primary electron beam so as to make the primary electron beam incident on the substrate substantially in parallel with a direction in which the secondary electron beam emits; and forming a separate electric field between the electromagnetic field and the cathode lens field to accelerate the secondary electron beam in the overlapping space, thereby suppressing aberration caused by the space charge effect in the overlapping space.

3. The substrate inspection method according to claim 2,
wherein a focal surface of the secondary electron beam is positioned in space where the secondary electron beam is accelerated,
a focus of the primary electron beam coincides with a focus of the secondary electron beam in the focal surface of the secondary electron beam, and
the electric fields to accelerate the secondary electron beam are formed so as to contain the focal point of the secondary electron beam.

4. The substrate inspection method according to claim 3,
wherein at least one of the electric fields to accelerate the secondary electron beam is rotationally symmetric about an optical axis of the secondary electron beam.

5. A method of manufacturing a semiconductor device comprising a substrate inspection method including:
generating an electron beam and irradiating the electron beam as a primary electron beam to a substrate as a specimen; inducing at least any of a secondary electron, a reflected electron, and a backscattering electron which are emitted from the substrate receiving the primary electron beam, and magnifying and projecting the induced electron as a secondary electron beam so as to form an image of the secondary electron beam, a trajectory of the primary electron beam and a trajectory of the secondary electron beam having an overlapping space and a space charge effect of the secondary electron beam occurring in the overlapping space;
detecting the image of the secondary electron beam to output a signal representing a state of the substrate; and
deflecting at least one of the primary electron beam and the secondary electron beam so as to shrink the overlapping space, thereby suppressing aberration caused by the space charge effect in the overlapping space,
wherein the primary electron beam or the secondary electron beam is deflected so that the primary electron beam has a focus at a position which is different from a focus of the secondary electron beam, and the focus of the primary electron beam and the focus of the secondary electron beam lie on a single focal surface.

6. A method of manufacturing a semiconductor device comprising a substrate inspection method including:
generating an electron beam and irradiating the electron beam as a primary electron beam to a substrate as a specimen via a cathode lens field;
inducing at least any of a secondary electron, a reflected electron, and a backscattering electron which are emitted from the substrate receiving the primary electron beam, and magnifying and projecting the induced electron as a secondary electron beam so as to form an image of the secondary electron beam, a trajectory of the primary electron beam and a trajectory of the secondary electron beam having an overlapping space and a space charge effect of the secondary electron beam occurring in the overlapping space;
detecting the image of the secondary electron beam to output a signal representing a state of the substrate;
generating an electromagnetic field which induces at least any of the secondary electron, the reflected electron and the backscattering electron without deflection so as to make the induced electron emit as the secondary electron beam, and which deflects the primary electron beam so as to make the primary electron beam incident on the substrate substantially in parallel with a direction in which the secondary electron beam emits; and forming a separate electric field between the electromagnetic field and the cathode lens field to accelerate the secondary electron beam in the overlapping space, thereby suppressing aberration caused by the space charge effect in the overlapping space.

7. The method of manufacturing a semiconductor device according to claim 6, wherein a focal surface of the secondary electron beam is positioned in space where the secondary electron beam is accelerated, a focus of the primary electron beam coincides with a focus of the secondary electron beam in the focal surface of the secondary electron beam, and the electric fields to accelerate the secondary electron beam are formed so as to contain the focal point of the secondary electron beam.

8. The method of manufacturing a semiconductor device according to claim 7, wherein at least one of the electric fields to accelerate the secondary electron beam is rotationally symmetric about an optical axis of the secondary electron beam.

9. A substrate inspection apparatus comprising:

an electron beam irradiator which generates an electron beam and which irradiates the electron beam as a primary electron beam to a substrate as a specimen;

a detector with a detecting surface to detect at least any of a secondary electron, a reflected electron and a backscattering electron which are emitted from the substrate receiving the primary electron beam, the detector outputting a signal representing a state of the substrate;

a mapping projection optical system which induces at least any of the secondary electron, the reflected electron, and the backscattering electron so as to magnify and project the induced electron as a secondary electron beam, and which forms an image of the secondary electron beam on the detecting surface of the detector, a trajectory of the primary electron beam and a trajectory of the secondary electron beam having an overlapping space and a space charge effect of the secondary electron beam occurring in the overlapping space; and a deflector which deflects at least one of the primary electron beam and the secondary electron beam so as to shrink the overlapping space, thereby suppressing aberration caused by the space charge effect in the overlapping space, wherein the deflector deflects the primary electron beam or the secondary electron beam so that the primary electron beam has a focus at a position which is different from a focus of the secondary electron beam, and the focus of the primary electron beam and the focus of the secondary electron beam lie on a single focal surface.

10. A substrate inspection apparatus comprising:

an electron beam irradiator which generates an electron beam and which irradiates the electron beam as a primary electron beam to a substrate as a specimen via a cathode lens;

a detector with a detecting surface to detect at least any of a secondary electron, a reflected electron and a backscattering electron which are emitted from the substrate receiving the primary electron beam, the detector outputting a signal representing a state of the substrate;

a mapping projection optical system which induces at least any of the secondary electron, the reflected electron, and the backscattering electron so as to magnify and project the induced electron as a secondary electron beam, and which forms an image of the secondary electron beam on the detecting surface of the detector, a trajectory of the primary electron beam and a trajectory of the secondary electron beam having an overlapping space and a space charge effect of the secondary electron beam occurring in the overlapping space;

an electromagnetic field superposing deflector which induces at least any of the secondary electron, the reflected electron, and the backscattering electron without deflection so as to make the induced electron emit as the secondary electron beam, and which deflects the primary electron beam so as to make the primary electron beam incident on the substrate substantially in parallel with a direction in which the secondary electron beam emits; and an aberration suppressor which forms a separate electric field between the electromagnetic field superposing deflector and the cathode lens to accelerate the secondary electron beam in the overlapping space.

11. The substrate inspection apparatus according to claim 10, wherein a focal surface of the secondary electron beam is positioned in space where the secondary electron beam is accelerated, a focus of the primary electron beam coincides with a focus of the secondary electron beam in the focal surface of the secondary electron beam, and the aberration suppressor includes at least two electrodes which are arranged so as to contain the focal point of the secondary electron beam and which form the electric field to accelerate the secondary electron beam.

12. The substrate inspection apparatus according to claim 11, wherein at least one of the electrodes has a rotationally symmetric form about an optical axis of the secondary electron beam.

13. The substrate inspection apparatus according to claim 9, further comprising:

an electromagnetic field superposing deflector which induces at least any of the secondary electron, the reflected electron and the backscattering electron without deflection so as to make the induced electron emit as the secondary electron beam, and which deflects the primary electron beam so as to make the primary electron beam incident on the substrate substantially in parallel with a direction in which the secondary electron beam emits.

14. The substrate inspection apparatus according to claim 11, wherein the at least two electrodes are arranged between the electromagnetic field superposing deflector and the substrate.

15. A substrate inspection method comprising:

generating an electron beam and irradiating the electron beam as a primary electron beam to a substrate as a specimen;

inducing at least any of a secondary electron, a reflected electron and a backscattering electron which are emitted from the substrate receiving the primary electron beam, and magnifying and projecting the induced electron as a secondary electron beam so as to form an image of the secondary electron beam, a trajectory of the primary electron beam and a trajectory of the secondary electron beam having an overlapping space and a space charge effect of the secondary electron beam occurring in the overlapping space;

detecting the image of the secondary electron beam to output a signal representing a state of the substrate; and forming a separate electric field to accelerate the secondary electron beam in a region of the overlapping space in which a current density of the primary beam is the highest, thereby suppressing aberration caused by the space charge effect in the overlapping space.

16. A method of manufacturing a semiconductor device comprising a substrate inspection method including:

generating an electron beam and irradiating the electron beam as a primary electron beam to a substrate as a specimen;

inducing at least any of a secondary electron, a reflected electron and a backscattering electron which are emitted from the substrate receiving the primary electron beam, and magnifying and projecting the induced electron as a secondary electron beam so as to form an image of the secondary electron beam, a trajectory of the primary electron beam and a trajectory of the secondary electron beam having an overlapping space and a space charge effect of the secondary electron beam occurring in the overlapping space;

detecting the image of the secondary electron beam to output a signal representing a state of the substrate; and forming a separate electric field to accelerate the secondary electron beam in a region of the overlapping space in which a current density of the primary beam is the highest, thereby suppressing aberration caused by the space charge effect in the overlapping space.

17. A substrate inspection apparatus comprising:

an electron beam irradiator which generates an electron beam and which irradiates the electron beam as a primary electron beam to a substrate as a specimen;

a detector with a detecting surface to detect at least any of a secondary electron, a reflected electron and a backscattering electron which are emitted from the substrate receiving the primary electron beam, the detector outputting a signal representing a state of the substrate;

a mapping projection optical system which induces at least any of the secondary electron, the reflected electron, and the backscattering electron so as to magnify and project the induced electron as a secondary electron beam, and which forms an image of the secondary electron beam on the detecting surface of the detector, a trajectory of the primary electron beam and a trajectory of the secondary electron beam having an overlapping space and a space charge effect of the secondary electron beam occurring in the overlapping space; and an aberration suppressor which forms a separate electric field to accelerate the secondary electron beam in a region of the overlapping space in which a current density of the primary beam is the highest, thereby suppressing aberration caused by the space charge effect in the overlapping space.

* * * * *